(12) United States Patent
Huang et al.

(10) Patent No.: US 12,165,992 B2
(45) Date of Patent: Dec. 10, 2024

(54) PACKAGE STRUCTURE AND FABRICATING METHOD THEREOF

(71) Applicant: Taiwan Semiconductor Manufacturing Company, Ltd., Hsinchu (TW)

(72) Inventors: Kuan-Yu Huang, Taipei (TW); Sung-Hui Huang, Yilan County (TW); Shang-Yun Hou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/327,076

(22) Filed: Jun. 1, 2023

(65) Prior Publication Data

US 2023/0307382 A1 Sep. 28, 2023

Related U.S. Application Data

(63) Continuation of application No. 17/685,378, filed on Mar. 3, 2022, now Pat. No. 11,705,407, which is a continuation of application No. 16/917,920, filed on Jul. 1, 2020, now Pat. No. 11,270,956.

(60) Provisional application No. 63/000,492, filed on Mar. 27, 2020.

(51) Int. Cl.
| | |
|---|---|
| *H01L 23/00* | (2006.01) |
| *H01L 21/56* | (2006.01) |
| *H01L 21/78* | (2006.01) |
| *H01L 23/31* | (2006.01) |
| *H01L 23/48* | (2006.01) |
| *H01L 23/498* | (2006.01) |
| *H01L 25/00* | (2006.01) |
| *H01L 25/065* | (2023.01) |

(52) U.S. Cl.
CPC .......... *H01L 23/562* (2013.01); *H01L 21/561* (2013.01); *H01L 21/78* (2013.01); *H01L 23/3128* (2013.01); *H01L 23/481* (2013.01); *H01L 23/49816* (2013.01); *H01L 23/49827* (2013.01); *H01L 25/0652* (2013.01); *H01L 25/0657* (2013.01); *H01L 25/50* (2013.01)

(58) Field of Classification Search
CPC ...... H01L 23/562; H01L 21/561; H01L 21/78
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |

(Continued)

*Primary Examiner* — Thao P Le
(74) *Attorney, Agent, or Firm* — JCIPRNET

(57) ABSTRACT

A semiconductor device including a first semiconductor die, a second semiconductor die, an insulating encapsulation and a warpage control pattern is provided. The first semiconductor die includes an active surface and a rear surface opposite to the active surface. The second semiconductor die is disposed on the active surface of the first semiconductor die. The insulating encapsulation is disposed on the active surface of the first semiconductor die and laterally encapsulates the second semiconductor die. The warpage control pattern is disposed on and partially covers the rear surface of the first semiconductor die.

20 Claims, 12 Drawing Sheets

(56) References Cited

U.S. PATENT DOCUMENTS

| | | | |
|---|---|---|---|
| 9,263,511 | B2 | 2/2016 | Yu et al. |
| 9,281,254 | B2* | 3/2016 | Yu .......................... H01L 24/97 |
| 9,368,460 | B2 | 6/2016 | Yu et al. |
| 9,372,206 | B2 | 6/2016 | Wu et al. |
| 9,496,189 | B2* | 11/2016 | Yu .......................... H01L 22/20 |
| 10,818,614 | B2* | 10/2020 | Chen .................. H01L 23/3128 |
| 11,532,576 | B2* | 12/2022 | Hsu ........................ H01L 24/03 |
| 2020/0105711 | A1* | 4/2020 | Kuo ...................... H01L 23/544 |
| 2020/0365525 | A1* | 11/2020 | Wu ....................... H01L 21/486 |

* cited by examiner

PACKAGE STRUCTURE AND FABRICATING METHOD THEREOF

CROSS-REFERENCE TO RELATED APPLICATION

This application a continuation application of and claims the priority benefit of U.S. application Ser. No. 17/685,378, filed on Mar. 3, 2022, now allowed. The U.S. application Ser. No. 17/685,378 is a continuation application of and claims the priority benefit of U.S. application Ser. No. 16/917,920, filed on Jul. 1, 2020, U.S. Pat. No. 11,270,956. The U.S. application Ser. No. 16/917,920 claims the priority benefit of U.S. provisional application Ser. No. 63/000,492, filed on Mar. 27, 2020. The entirety of each of the above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for warpage control techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
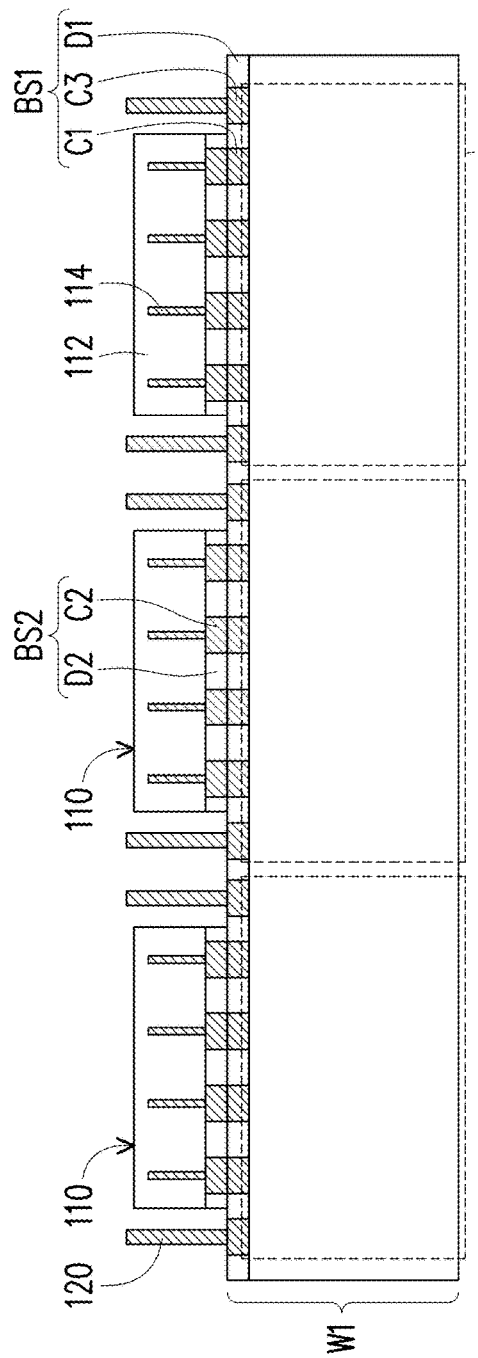
FIG. 1 through FIG. 7 are cross-sectional views schematically illustrating a process flow for fabricating a system on integrated circuit (SoIC) component in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 7 are cross-sectional views schematically illustrating a process flow for fabricating a system on integrated circuit (SoIC) component in accordance with some embodiments of the present disclosure.

Referring to FIG. 1, a semiconductor wafer W1 including first semiconductor dies 100 is provided. The first semiconductor dies 100 may be logic dies, System-on-Chip (SoC) dies or other suitable semiconductor dies. The semiconductor wafer W1 may include a semiconductor substrate and an interconnect structure disposed on the semiconductor substrate. The semiconductor substrate of the semiconductor wafer W1 may include a crystalline silicon substrate (e.g., wafer). The semiconductor substrate may include various doped regions depending on design requirements (e.g., p-type substrate or n-type substrate). In some embodiments, the doped regions may be doped with p-type or n-type dopants. The doped regions may be doped with p-type dopants, such as boron or $BF_2$; n-type dopants, such as phosphorus or arsenic; and/or combinations thereof. The doped regions may be configured for n-type Fin-type Field Effect Transistors (FinFETs) and/or p-type FinFETs. In some alternative embodiments, the semiconductor substrate may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

The interconnect structure may include stacked interlayered dielectric layers and interconnect wirings embedded in the stacked interlayered dielectric layers, and the interconnect wirings are electrically connected to the semiconductor devices (e.g., FinFETs) formed in the semiconductor substrate. The material of the interlayered dielectric layers may include silicon oxide ($SiO_x$, where x>0), silicon nitride ($SiN_x$, where x>0), silicon oxynitirde ($SiO_xN_y$, where x>0 and y>0) or other suitable dielectric material. The interconnect wirings may include metallic wirings having different coefficient of thermal expansion (CTE). For example, the interconnect wirings include copper wirings, copper pads, aluminum pads or combinations thereof, wherein coefficient of thermal expansion (CTE) of the copper wirings and copper pads may be about 17.5 ppm/Celsius degree, and CTE of the aluminum pads may be about 23.2 ppm/Celsius degree.

The semiconductor wafer W1 may further include a first bonding structure BS1 formed over the first semiconductor dies 100. The first bonding structure BS1 may include a first bonding dielectric layer D1 and first bonding conductors C1 embedded in the first bonding dielectric layer D1. The material of the first bonding dielectric layer D1 may be silicon oxide ($SiO_x$, where x>0), silicon nitride ($SiN_x$, where x>0), silicon oxynitirde ($SiO_xN_y$, where x>0 and y>0) or other suitable dielectric material, and the first bonding conductors C1 may be conductive vias (e.g., copper vias), conductive pads (e.g., copper pads) or combinations thereof. The first bonding structure BS1 may be formed by depositing a dielectric material through a chemical vapor deposition (CVD) process (e.g., a plasma enhanced CVD process or other suitable process); patterning the dielectric material to form the first bonding dielectric layer D1 including openings or through holes; and filling conductive material in the openings or through holes defined in the first bonding dielectric layer D1 to form the first bonding conductors C1 embedded in the first bonding dielectric layer D1.

Second semiconductor dies 110 are picked-up and placed on the semiconductor wafer W1 such that the second semiconductor dies 110 are electrically connected to the first semiconductor dies 100 of the semiconductor wafer W1. In some embodiments, the second semiconductor dies 110 may be memory dies such as Static Random Access Memory (SRAM) dies, memory stacks or other suitable memory dies. The second semiconductor dies 110 may each include a semiconductor substrate 112, an interconnect structure disposed on the semiconductor substrate 112, and through semiconductor vias (TSVs) 114 embedded in the semiconductor substrate 112. The interconnect structure of the second semiconductor die 110 may include stacked interlayered dielectric layers and interconnect wirings embedded in the stacked interlayered dielectric layers, and the interconnect wirings are electrically connected to the semiconductor devices (e.g., FinFETs) formed in the semiconductor substrate 112. The material of the interlayered dielectric layers may include silicon oxide ($SiO_x$, where x>0), silicon nitride ($SiN_x$, where x>0), silicon oxynitirde ($SiO_x N_y$, where x>0 and y>0) or other suitable dielectric material. The interconnect wirings may include metallic wirings having different coefficient of thermal expansion (CTE). For example, the interconnect wirings include copper wirings, copper pads, aluminum pads or combinations thereof, wherein coefficient of thermal expansion (CTE) of the copper wirings and copper pads may be about 17.5 ppm/Celsius degree, and CTE of aluminum pads may be about 23.2 ppm/Celsius degree. Each of the second semiconductor dies 110 may further include a second bonding structure BS2, wherein the second bonding structures BS2 may each include a second bonding dielectric layer D2 and second bonding conductors C2 embedded in the second bonding dielectric layer D2. The material of the second bonding dielectric layers D2 may be the same as or different from that of the first bonding dielectric layer D1, and the material of the second conductors C2 may be the same as or different from that of the conductors C1. For example, the material of the second bonding dielectric layers D2 includes silicon oxide ($SiO_x$, where x>0), silicon nitride ($SiN_x$, where x>0), silicon oxynitirde ($SiO_x N_y$, where x>0 and y>0) or other suitable dielectric material, and the second bonding conductors C2 includes conductive vias (e.g., copper vias), conductive pads (e.g., copper pads) or combinations thereof. The second bonding structures BS2 may be formed by depositing a dielectric material through a CVD process (e.g., a plasma enhanced CVD process or other suitable deposition process); patterning the dielectric material to form the second bonding dielectric layer D2 including openings or through holes; and filling conductive material in the openings or through holes defined in the second bonding dielectric layer D2 to form the second bonding conductors C2 embedded in the second bonding dielectric layer D2.

In some embodiments, the second semiconductor dies 110 are electrically connected to the first semiconductor dies 100 of the semiconductor wafer W1 through the first bonding structure BS1 and the second bonding structure BS2. The first bonding structure BS1 and the second bonding structure BS2 may be bonded to each other. When performing the bonding process of the second semiconductor dies 110 and the semiconductor wafer W1, the second bonding conductors C2 of the second bonding structure BS2 are aligned with the first bonding conductors C1 of the first bonding structure BS1, and sub-micron alignment precision between the second semiconductor dies 110 and the semiconductor wafer W1 may be achieved. Once the second semiconductor dies 110 and the semiconductor wafer W1 are aligned, a chip-to-wafer (CoW) bonding may be performed such that the semiconductor dies 160 are bonded to the semiconductor wafer W1.

In some embodiments, to facilitate the chip-to-wafer (CoW) bonding between the second semiconductor dies 110 and the semiconductor wafer W1, surface preparation for bonding surfaces of the bonding structures BS1 and BS2 is performed. The surface preparation may include surface cleaning and activation, for example. Surface cleaning may be performed on the bonding surfaces of the bonding structures BS1 and BS2 to remove particles on bonding surfaces of the first bonding conductors C1, the first bonding dielectric layer D1, the second bonding conductors C2 and the second bonding dielectric layers D2. The bonding surfaces of the bonding structures BS1 and BS2 are cleaned by wet cleaning, for example. Not only particles may be removed, but also native oxide formed on the bonding surfaces of the first bonding conductors C1 and the second bonding conductors C2 may be removed. The native oxide formed on the bonding surfaces of the first bonding conductors C1 and the second bonding conductors C2 may be removed by chemicals used in the wet cleaning.

After cleaning the bonding surfaces of the bonding structures BS1 and BS2, activation of the top surfaces of the first bonding dielectric layer D1 and the second dielectric layers D2 may be performed for development of high bonding strength. In some embodiments, plasma activation is performed to treat the bonding surfaces of the first bonding dielectric layer D1 and the second dielectric layers D2. When the activated bonding surface of the first bonding dielectric layer D1 is in contact with the activated bonding surfaces of the second dielectric layers D2, the first bonding dielectric layer D1 and the second dielectric layers D2 of the second semiconductor dies 110 are pre-bonded. After the pre-bonding of the first bonding dielectric layer D1 and the second dielectric layers D2, the first bonding conductors C1 are physically in contact with the second bonding conductors C2.

After the pre-bonding of the first bonding dielectric layer D1 and the second dielectric layers D2, a hybrid bonding between the first bonding structure BS1 and the second bonding structure BS2 is accomplished. The hybrid bonding of the second semiconductor dies 110 and semiconductor wafer W1 may further include a treatment for dielectric bonding and a thermal annealing for conductor bonding. The treatment for dielectric bonding is performed to strengthen the bonding between the first bonding dielectric layer D1 and the second dielectric layers D2. The treatment for dielectric bonding may be performed at temperature ranging from about 100 Celsius degree to about 150 Celsius degree. After performing the treatment for dielectric bonding, the thermal annealing for conductor bonding is performed to facilitate the bonding between the first bonding conductors C1 and the second bonding conductors C2. The thermal annealing for conductor bonding may be performed at temperature ranging from about 300 Celsius degree to about 400 Celsius degree. The process temperature of the thermal annealing for conductor bonding is higher than that of the treatment for dielectric bonding. Since the thermal annealing for conductor bonding is performed at relative higher temperature, metal diffusion and grain growth may occur at bonding interfaces between the first bonding conductors C1 and the second bonding conductors C2. After performing the thermal annealing for conductor bonding, the first bonding dielectric layer D1 is bonded to the second dielectric layers D2, and the first bonding conductors C1 are bonded to the second bonding conductors C2. The conductor bonding between the first bonding conductors C1 and the second bonding conductors C2 may be via-to-via bonding, pad-to-pad bonding or via-to-pad bonding.

Other types of bonding process may be performed to bond the second semiconductor dies 110 and the first semiconductor dies 100 in the semiconductor wafer W1.

As illustrated in FIG. 1, through insulator vias (TIVs) 120 are formed over the semiconductor wafer W1. The TIVs 120 are electrically connected to conductors C3 in the first bonding structure BS1, and the conductors C3 are not covered by the second semiconductor dies 110. The TIVs 120 are spaced apart from the second semiconductor dies 110 by a distance. In some embodiments, the height of the TIVs 120 may be greater than the thickness of the second semiconductor dies 110. In some alternative embodiments, the height of the TIVs 120 may be less than or substantially equal to the thickness of the second semiconductor dies 110

Figure 2:
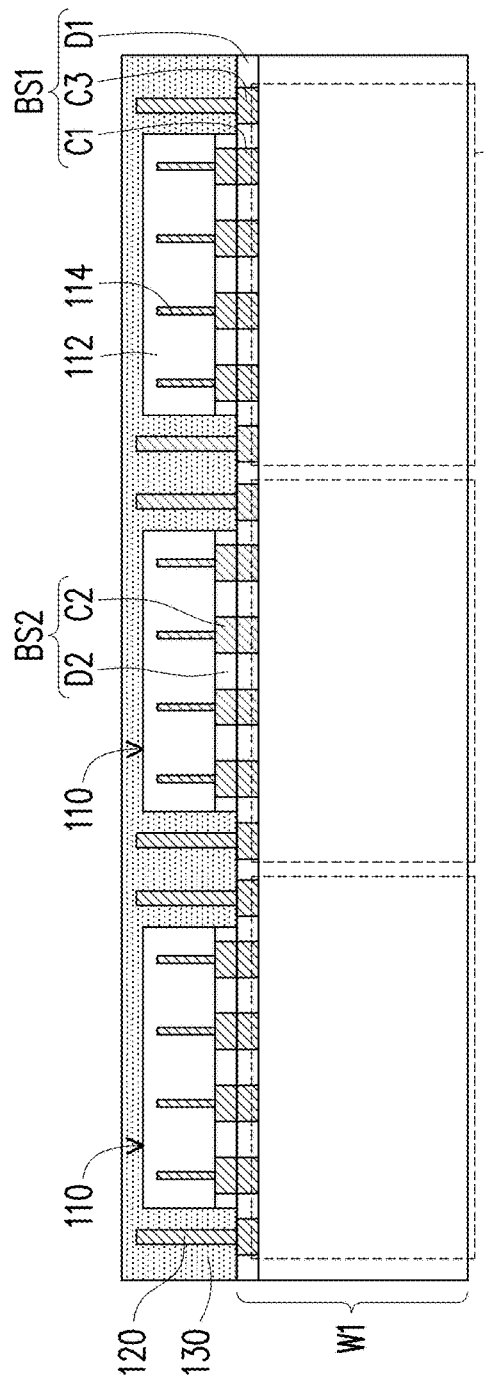
Figure 3:
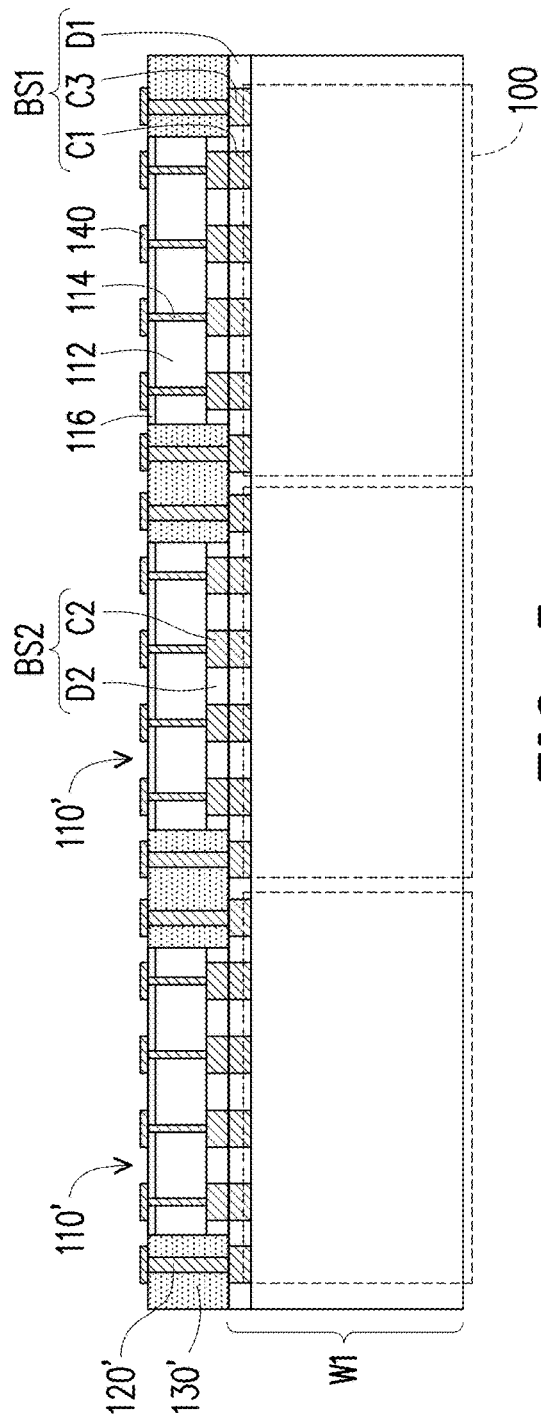

Referring to FIG. 2 and FIG. 3, an insulating material 130 is formed over the semiconductor wafer W1 to cover the second semiconductor dies 110 and the TIVs 120. In some embodiments, the insulating material 130 is formed by an over-molding process or a deposition process such that the second semiconductor dies 110 and the TIVs 120 are entirely covered by the insulating material 130. After performing the over-molding process or deposition process, a grinding process may be performed to reduce the thickness of the insulating material 130, the second semiconductor dies 110 and the TIVs 120 such that semiconductor dies 110' with reduced thickness, TIVs 120' with reduced height and an insulating encapsulation 130' are formed on the semiconductor wafer W1. After performing the grinding process, the TSVs 114 are revealed from rear surfaces of the semiconductor dies 110'. In some embodiments, the above-mentioned grinding process includes a mechanical grinding process, a chemical mechanical polishing (CMP) process, or combinations thereof.

In some alternative embodiments, the TIVs 120' with reduced height may be formed after forming the insulating encapsulation 130'. For example, the insulating encapsulation 130' is patterned through a laser drilling process, a photolithography process followed by an etching process or other suitable patterning processes such that through holes are formed in the insulating encapsulation 130', and a conductive material is filled in the through holes defined in the insulating encapsulation 130' to form the TIVs 120'. After through holes are formed in the insulating encapsulation 130', the TIVs 120' may be formed by a deposition process of conductive material followed by a CMP process. A metallic material (e.g., copper) is deposited over the semiconductor dies 110' and the insulating encapsulation 130' to fill the through holes defined in the insulating encapsulation 130', and the metallic material is then polished through a CMP process until the semiconductor dies 110' and the insulating encapsulation 130' are revealed.

As illustrated in FIG. 2 and FIG. 3, after performing the grinding process, a recessing process of the semiconductor substrates 112 may be performed such semiconductor substrates 112' with reduced thickness are formed, and the TSVs 114 may slightly protrude from the rear surfaces of the semiconductor substrates 112'. After performing the recessing process of the semiconductor substrates 112, dielectric layers 116 are formed to cover the rear surfaces of the semiconductor substrates 112'. The top surfaces of the dielectric layers 116 may be substantially leveled with the top surface of the insulating encapsulation 130'. In some embodiments the dielectric layer 116 may be formed by a deposition process of a dielectric material followed by a CMP process. A dielectric material (e.g., silicon nitride) may be deposited over the rear surfaces of the semiconductor substrates 112' and the insulating encapsulation 130' to fill the recesses formed by the above-mentioned recessing process, and the dielectric material is then polished through a CMP process until the top surface of the insulating encapsulation 130' are revealed.

A redistribution circuit structure 140 may be formed over the semiconductor dies 110' and the insulating encapsulation 130'. The redistribution circuit structure 140 is electrically connected to the semiconductor die 100 of the semiconductor wafer W1' and the semiconductor die 110'. As illustrated in FIG. 3, the redistribution circuit structure 140 is electrically connected to the TSVs 114 of the semiconductor dies 110' and the TIV 120' embedded in the insulating encapsulation 130'. In some embodiments, the redistribution circuit structure 140 includes bump pads and redistribution wirings, wherein subsequently formed conductive bumps 160 (illustrated in FIG. 6) are formed on the bump pads of the redistribution circuit structure 140.

As illustrated in FIG. 3, the semiconductor dies 110' each includes the semiconductor substrate 112, the TSVs 114 and the dielectric layer 116, the thickness of the semiconductor dies 110' is substantially equal to the thickness of the insulating encapsulation 130', and the semiconductor dies 110' are laterally encapsulated by the insulating encapsulation 130'. In other words, the insulating encapsulation 130' is in contact with side surfaces of the semiconductor dies 110', and rear surfaces of the semiconductor dies 110' (i.e. the dielectric layers 116) are accessibly revealed by the insulating encapsulation 130'. In some alternative embodiments, not illustrated in FIG. 3, the thickness of the semiconductor dies is slightly less than or greater than the thickness of the insulating encapsulation due to grinding selectivity of the grinding process. In other words, the top surface of the insulating encapsulation may be slightly higher than or slightly lower than the rear surfaces of the semiconductor dies.

Figure 4:
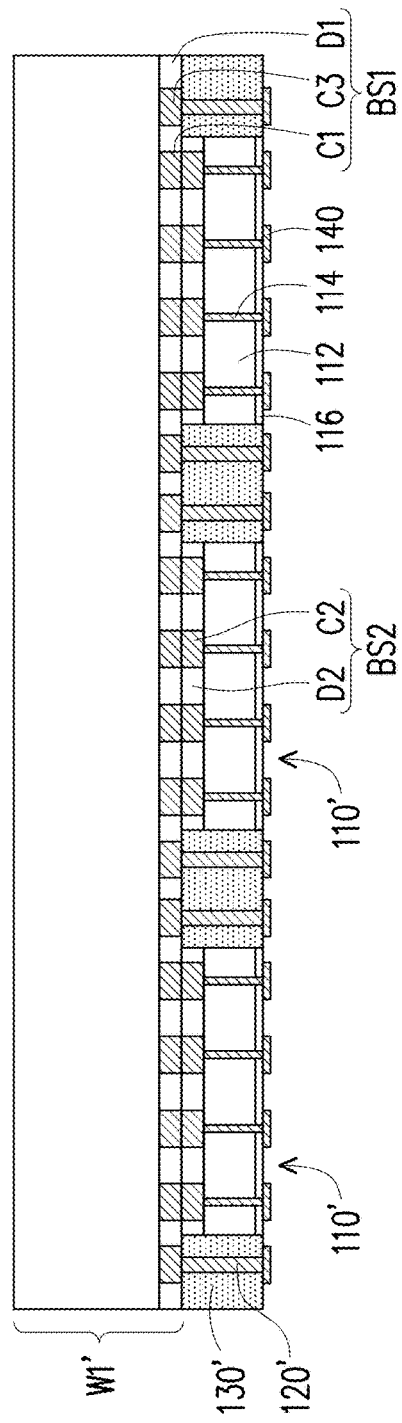

Referring to FIG. 3 and FIG. 4, a thinning process may be performed on the semiconductor wafer W1 such that the thickness of the semiconductor wafer W1 is reduced and a thinned semiconductor wafer W1' is formed. In some embodiments, the resulted structure illustrated in FIG. 3 is flipped upside down and a grinding process is performed to thin down the semiconductor wafer W1. The above-mentioned grinding process for thinning the semiconductor wafer W1 may include a mechanical grinding process, a chemical mechanical polishing (CMP) process, or combinations thereof. Before performing the thinning process of the semiconductor wafer W1, the semiconductor wafer W1 illustrated in FIG. 3 may have a thickness of about or greater than 750 micrometers. After performing the thinning process of the semiconductor wafer W1, the thinned semiconductor wafer W1' illustrated in FIG. 4 may have a thickness ranging from about 700 micrometers to about 1550 micrometers.

Figure 5:
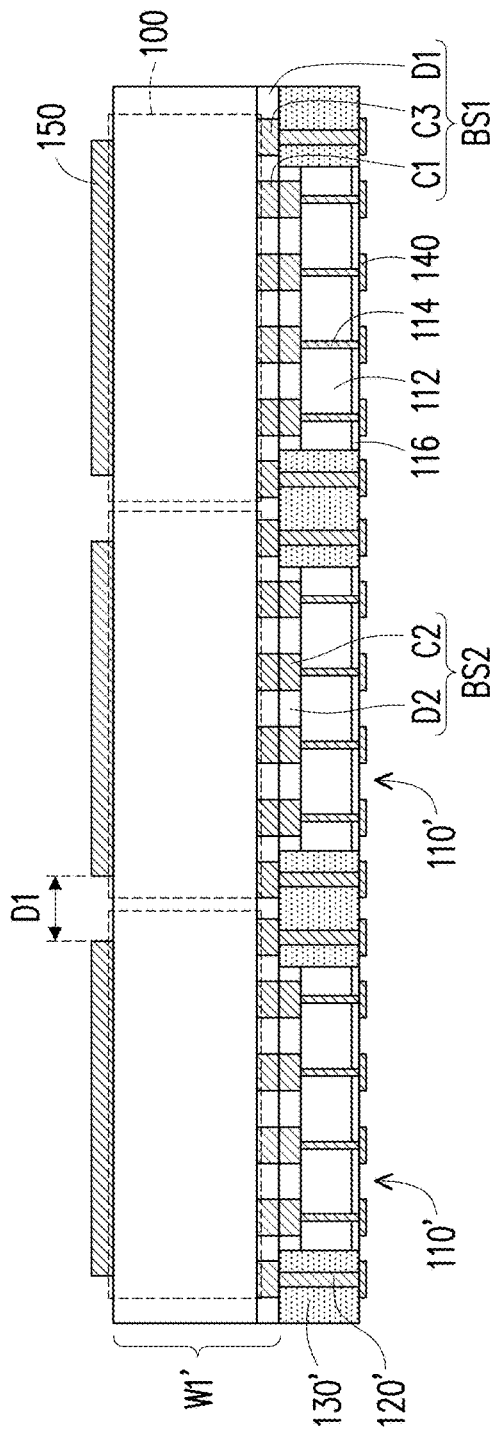

Referring to FIG. 5, warpage control patterns 150 are formed on a rear surface of the semiconductor wafer W1'. The warpage control patterns 150 may be electrically floating. In some embodiments, the warpage control patterns 150 are formed by a deposition process of conductive material followed by a patterning process. A conductive material (e.g., copper) may be formed on the rear surface of the semiconductor wafer W1' through a plating process, and the plated conductive material formed on the rear surface of the semiconductor wafer W1' may be patterned through a photolithography and etching process. The thickness of the warpage control patterns 150 may range from about 5 micrometers to about 15 micrometers to properly minimize warpage of the semiconductor wafer W1'. The warpage control patterns 150 may include rectangular patterns spaced apart from one another by a lateral distance D1. In some embodiments, the warpage control patterns 150 covers the rear surface of the semiconductor wafer W1' as much as possible. An area of the warpage control patterns 150 (i.e. an area covered or occupied by the warpage control patterns 150) may be A1, an area of the rear surface of the semiconductor wafer W1' may be A2, and a ratio of A1 to A2 may range from about 70% to about 99.9%. The lateral distance D1 between two neighboring warpage control patterns 150 may range from about 120 micrometers to about 3000 micrometers. The warpage control patterns 150 formed on the rear surface of the semiconductor wafer W1' may counterbalance the thermal expansion of the interconnect wirings (e.g., copper wirings, copper pads, aluminum pads or combinations thereof) such that warpage of the semiconductor wafer W1' may be controlled and minimized.

Figure 6:
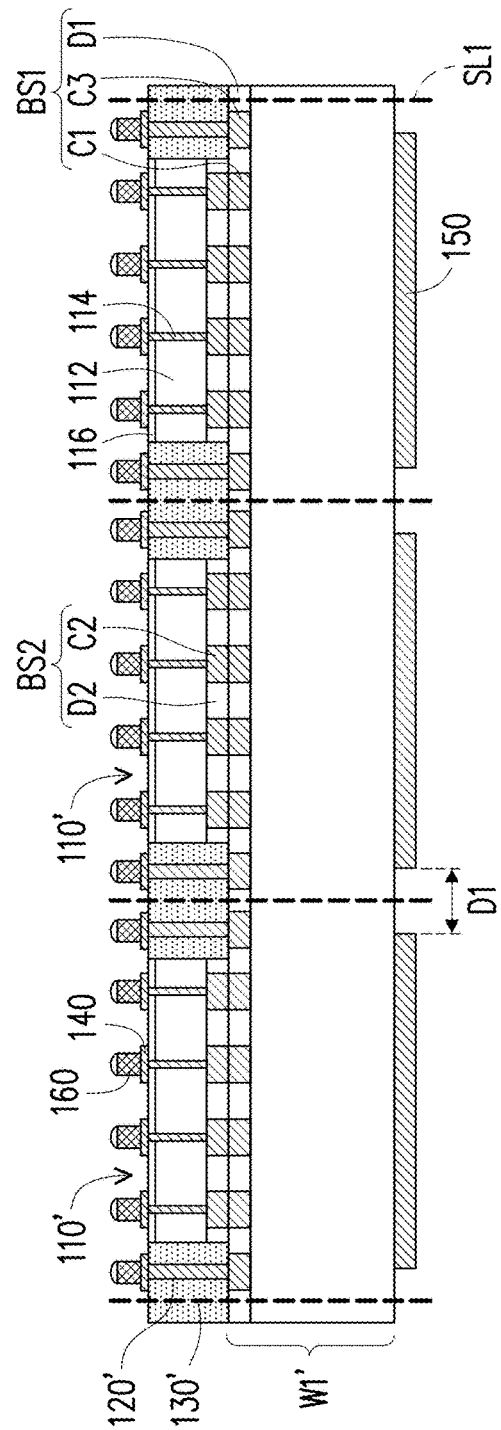

Referring to FIG. 5 and FIG. 6, after forming the warpage control patterns 150, the resulted structure illustrated in FIG. 5 is flipped upside down, and a wafer level bumping process is performed to form conductive bumps 160 on the redistribution circuit structure 140. The conductive bumps 160 may be micro-bumps, and each of the micro-bumps may include a copper pillar landed on the redistribution circuit structure 140 and a solder material covering the copper pillar. In some embodiments, a seed layer is formed on the rear surfaces of the semiconductor dies 110' and the insulating encapsulation 130' through a sputter process; a patterned photoresist layer is formed on the seed layer to cover the rear surfaces of the semiconductor dies 110' and the insulating encapsulation 130' through a photolithography process such that portions of the seed layer located above the bump pads of the redistribution circuit structure 140 are revealed by the patterned photoresist layer; a plating process is performed such that the conductive bumps 160 are formed on the bump pads of the redistribution circuit structure 140; and portions of the seed layer are removed through an etching process by using the conductive bumps 160 as an etch mask.

In some embodiments, as illustrated in FIG. 6, the conductive bumps 160 are formed on the redistribution circuit structure 140 after the formation of the warpage control patterns 150. In some alternative embodiments, the conductive bumps 160 are formed on the redistribution circuit structure 140 prior to the thinning process (illustrated in FIG. 4) of the semiconductor wafer W1. In other words, the conductive bumps 160 may be formed on the redistribution circuit structure 140 prior to the formation of the warpage control patterns 150.

As illustrated in FIG. 6, after forming the warpage control patterns 150 and the conductive bumps 160, a reconstructed wafer including the semiconductor wafer W1', the semiconductor dies 110', the TIVs 120', the insulating encapsulation 130', the redistribution circuit structure 140, the warpage control patterns 150 and the conductive bumps 160 is obtained.

Figure 7:
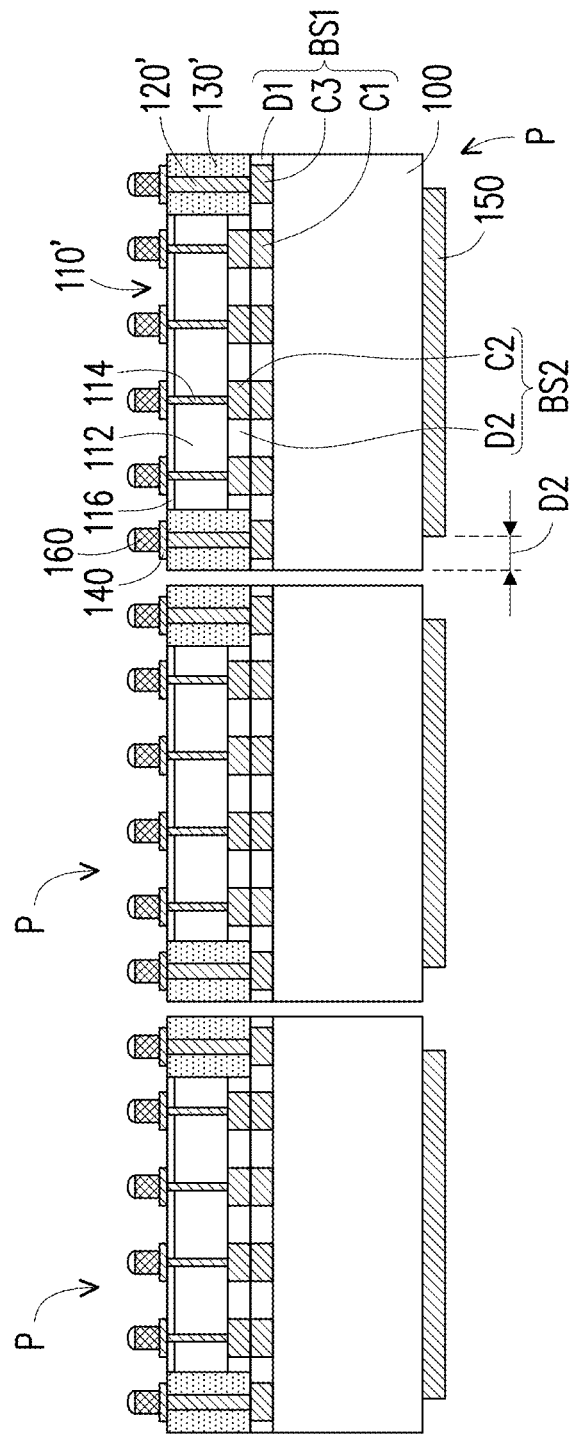

Referring to FIG. 6 and FIG. 7, a wafer saw process for singulation of the reconstructed wafer is performed along scribe lines SL1 such that singulated semiconductor components P (e.g., singulated SoIC components) are obtained. In some embodiments, the reconstructed wafer illustrated in FIG. 6 is singulated through a blade to form the singulated semiconductor components P, and the warpage control patterns 150 are not in contact by the blade when performing the wafer saw process. For example, the width of the scribe lines SL1 may range from about 60 micrometers to about 1000 micrometers. As mentioned above, in an embodiment where the lateral distance D1 between two neighboring warpage control patterns 150 ranges from about 120 micrometers to about 3000 micrometers, the warpage control patterns 150 can keep a safe distance from the blade used in the wafer saw process of the reconstructed wafer. Accordingly, the lifetime of the blade used in the wafer saw process of the reconstructed wafer may increase.

Each semiconductor component P may include at least one semiconductor die 100, at least one semiconductor die 110', TIVs 120', an insulating encapsulation 130', a redistribution circuit structure 140, at least one warpage control pattern 150, and conductive bumps 160. The semiconductor die 100 may include an active surface and a rear surface opposite to the active surface. The semiconductor die 110' may be disposed on the active surface of the semiconductor die 100. The TIVs 120' penetrate through the insulating encapsulation 130', wherein the TIVs 120' are electrically connected to the semiconductor die 100 and the redistribution circuit structure 140. The insulating encapsulation 130' may be disposed on the active surface of the semiconductor die 100 and laterally encapsulates the semiconductor die 110'. The warpage control pattern 150 may be disposed on and partially covers the rear surface of the semiconductor die 100. The redistribution circuit structure 140 may be disposed on the semiconductor die 110' and the insulating encapsulation 130', wherein the redistribution circuit structure 140 is electrically connected to the semiconductor die 100 and the semiconductor die 110'. The conductive terminals 160 may be disposed on and electrically connected to the redistribution circuit structure 140.

In some embodiments, in the singulated semiconductor components P, a sidewall of the warpage control pattern 150 is separated from a sidewall of the semiconductor die 100 by a lateral distance D2. The lateral distance D2 may range from about 30 micrometers to about 1000 micrometers, and a thickness of the warpage control pattern 150 may range from about 5 micrometers to about 15 micrometers. The warpage of singulated semiconductor component P may be well controlled and minimized by the warpage control pattern 150 because the warpage control pattern 150 counterbalances the thermal expansion of the interconnect wirings.

FIG. 8 through FIG. 11 are cross-sectional views schematically illustrating a process flow for fabricating package structures in accordance with some other embodiments of the present disclosure.

Figure 8:
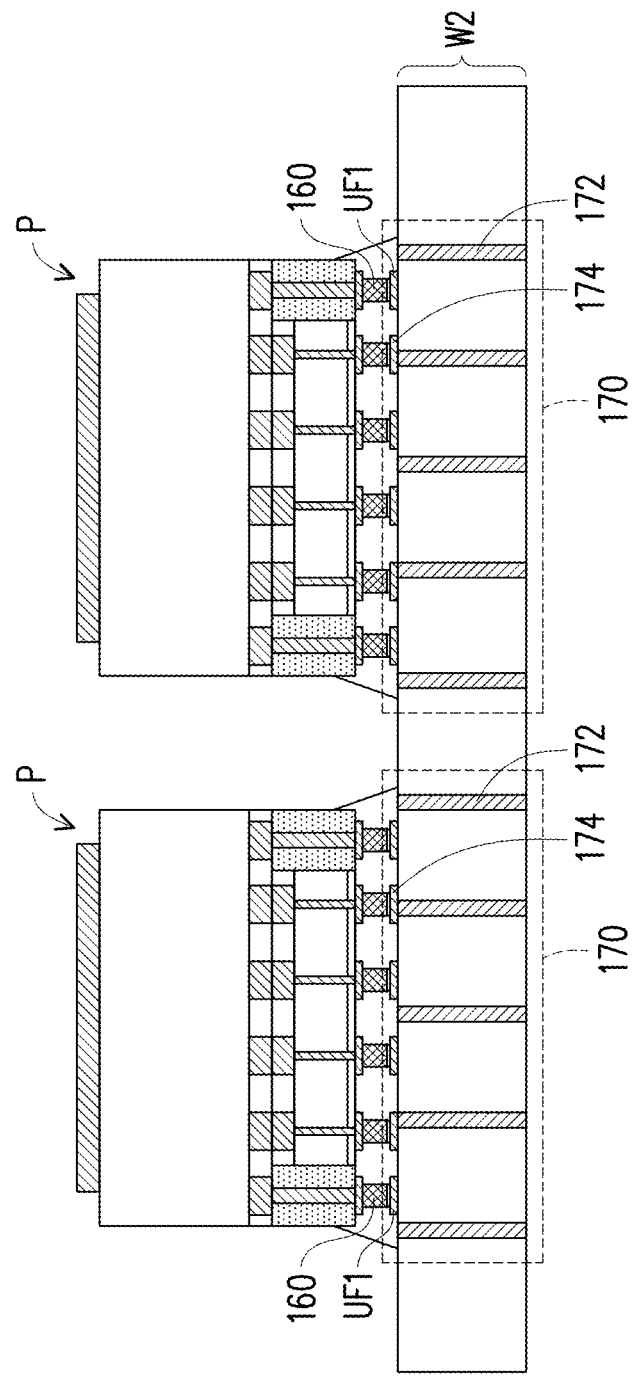
FIG. 8 through FIG. 11 are cross-sectional views schematically illustrating a process flow for fabricating package structures in accordance with some other embodiments of the present disclosure.

Referring to FIG. 8, an interposer wafer W2 including multiple interposers 170 is provided. Each of the interposers 170 of the interposer wafer W2 may include through vias 172 and bump pads 174 electrically connected to the through vias 172. The interposer wafer W2 may be a silicon interposer wafer or other suitable semiconductor interposer wafer. The singulated semiconductor components P are picked-up and placed over the interposer wafer W2, and a Chip-to-Wafer (CoW) bonding process may be performed to bond the singulated semiconductor components P with the interposer wafer W2. In some embodiments, the singulated semiconductor components P are flipped on the interposer wafer W2 such that the conductive bumps 160 of the singulated semiconductor components P can be bonded with the bump pads 174 of the interposer wafer W2 through a reflow process.

After bonding the singulated semiconductor components P to the interposer wafer W2, underfills UF1 may be formed between the singulated semiconductor components P and the interposer wafer W2 such that the conductive bumps 160 of the singulated semiconductor components P are laterally encapsulated by the underfills UF1. The underfills UF1 may be formed over the interposer wafer W2 through a dispensing process following by a curing process. In some embodiments, the material of the underfills UF1 includes silica ($SiO_2$), resin, epoxy or combinations thereof.

Figure 9:
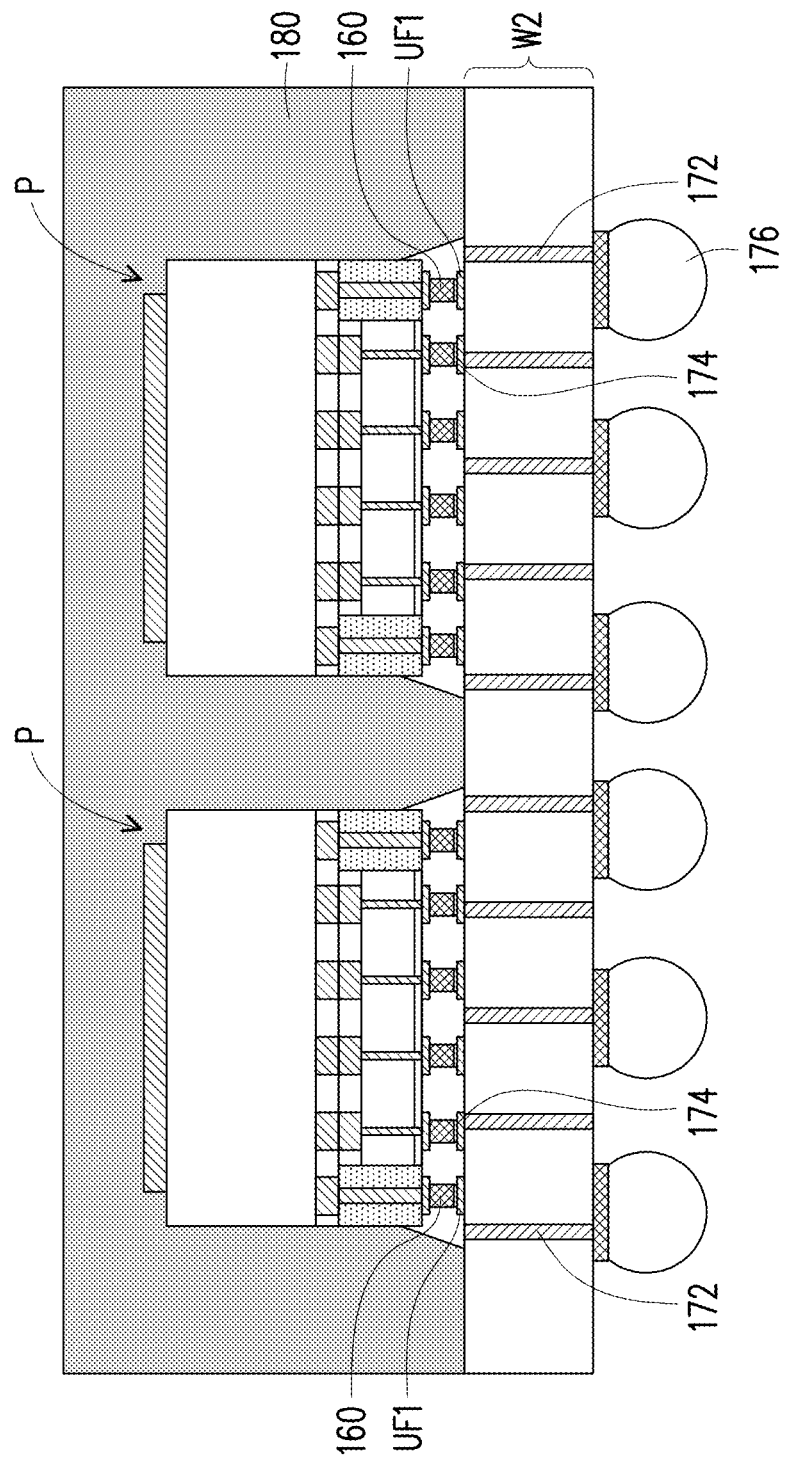

Referring to FIG. 9, an insulating material 180 is formed over the top surface of the interposer wafer W2 to encapsulate the singulated semiconductor components P and the underfills UF1. In some embodiments, the insulating material 180 is formed by an over-molding process or a deposition process such that the singulated semiconductor components P are entirely covered by the insulating material 180. The insulating material 180 may cover top surfaces and sidewalls of the warpage control patterns 150. After forming the insulating material 180, conductive terminals 176 may be formed on the bottom surface of the interposer wafer W2. In some embodiments, the conductive terminals 176 includes Controlled Collapse Chip Connection bumps (C4 bumps). In some alternative embodiments, the conductive terminals 176 includes solder balls formed through a ball mount process followed by a reflow process.

Figure 10:
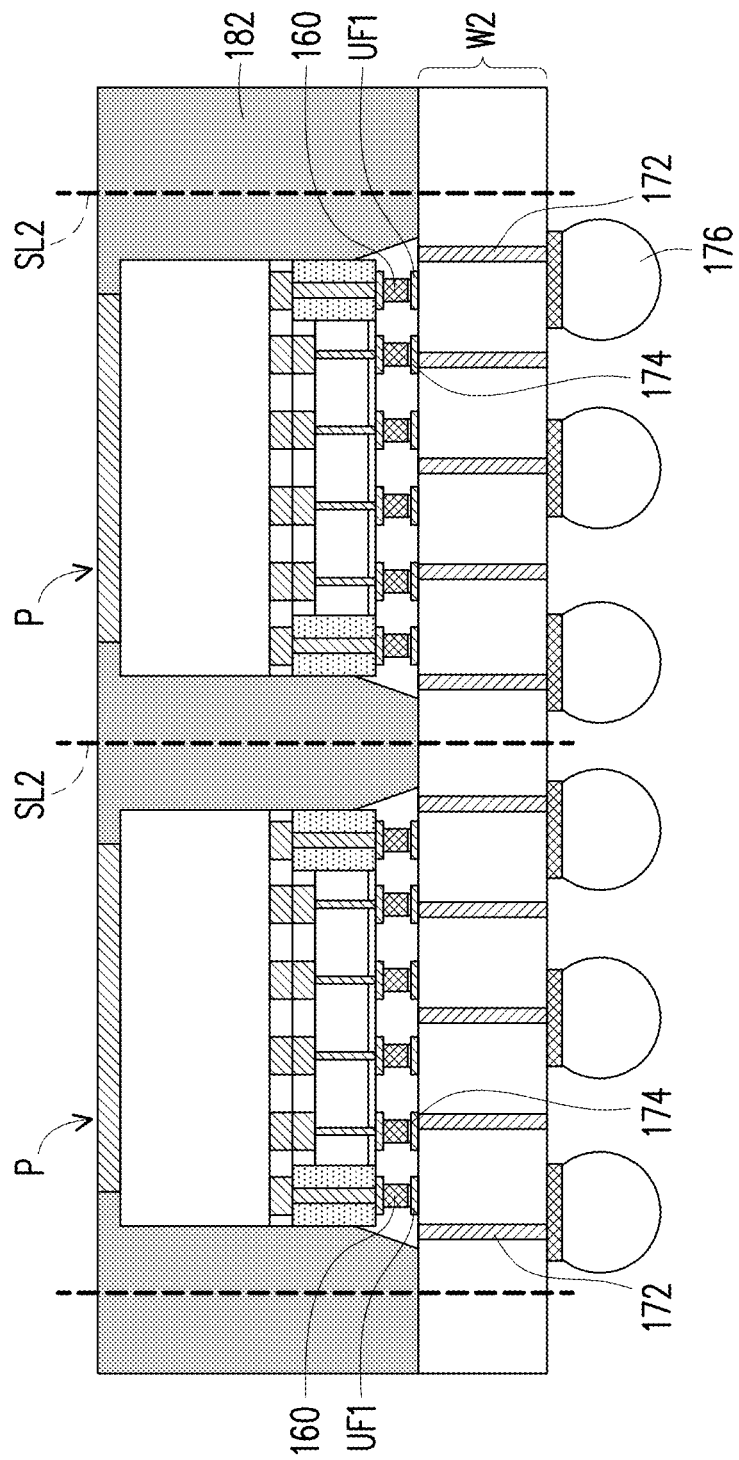

Referring to FIG. 9 and FIG. 10, after forming the insulating material 180, a grinding process may be performed to partially remove the insulating material 180 to form an insulating encapsulation 182, wherein the insulating encapsulation 182 laterally encapsulates the singulated semiconductor components P. In some embodiments, after performing the over-molding process or deposition process, a single step or multi-step grinding process is performed to reduce the thickness of the insulating material 180 until top surfaces of the warpage control patterns 150 are revealed. After performing the grinding process, the top surfaces of the warpage control patterns 150 are revealed from a top surface of the insulating encapsulation 182, and the top surfaces of the warpage control patterns 150 may be substantially leveled with the top surface of the insulating encapsulation 182. In some alternative embodiments, the top surfaces of the warpage control patterns 150 may be slightly higher or lower than the top surface of the insulating encapsulation 182 due to grinding selectivity of the grinding process. The insulating encapsulation 182 covers the sidewalls of the warpage control patterns 150. In some embodiments, the above-mentioned grinding process for partially removing the insulating material 180 includes a mechanical grinding process, a chemical mechanical polishing (CMP) process, or combinations thereof.

After forming the insulating encapsulation 182 and the conductive terminals 176, a reconstructed wafer including the interposer wafer W2, the singulated semiconductor components P, the insulating encapsulation 182 and the conductive bumps 176 is obtained.

Figure 11:
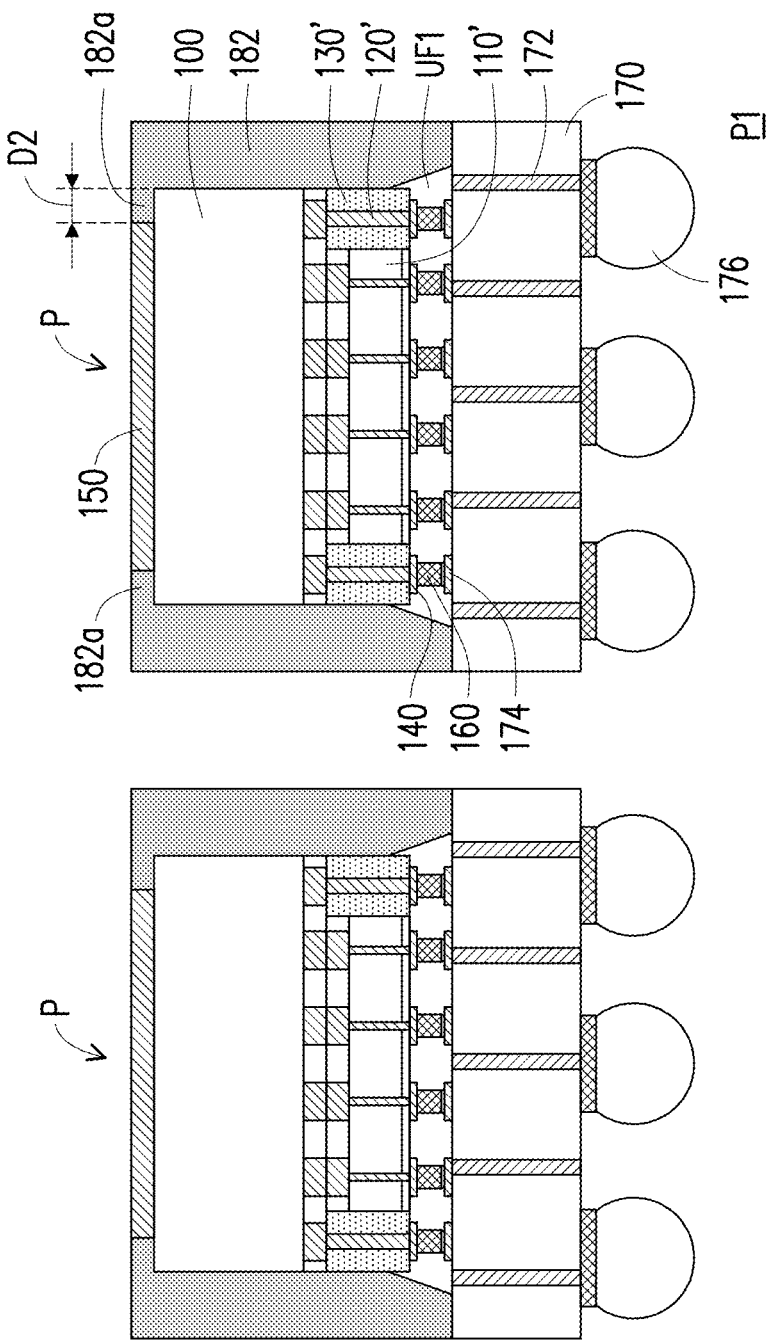

Referring to FIG. 10 and FIG. 11, a wafer saw process for singulation of the reconstructed wafer illustrated in FIG. 10 is performed along scribe lines SL2 such that singulated package structures P1 are obtained. In some embodiments, the reconstructed wafer illustrated in FIG. 10 is singulated through a blade to form the singulated package structures P1. The singulated package structure P1 may include an interposer 170, a semiconductor component P, an insulating encapsulation 182 and an underfill UF1. The semiconductor component P is disposed on and electrically connected to the interposer 170. The semiconductor component P includes a semiconductor die 100, a semiconductor die 110', an insulating encapsulation 130' and a warpage control pattern 150. The semiconductor die 100 includes an active surface and a rear surface opposite to the active surface. The semiconductor die 110' is bonded with the active surface of the semiconductor die 100. The insulating encapsulation 130' is disposed on the active surface of the semiconductor die 100 and laterally encapsulates the semiconductor die 110', wherein sidewalls of the insulating encapsulation 130' is substantially aligned with sidewalls of the semiconductor die 100. The warpage control pattern 150 is disposed on and partially covers the rear surface of the semiconductor die 100. The insulating encapsulation 182 is disposed on the interposer 170 and laterally encapsulating the semiconductor component P. The underfill UF1 is disposed between the semiconductor component P and the interposer 170.

The semiconductor component P may further include a redistribution circuit structure 140 disposed on the semiconductor die 110' and the insulating encapsulation 130', wherein the redistribution circuit structure 140 is electrically connected to the semiconductor die 100 and the semiconductor die 110'. The semiconductor component P may further include conductive terminals 160 disposed on and electrically connected to the redistribution circuit structure 140. A sidewall of the warpage control pattern 150 may be separated from a sidewall of the semiconductor die 100 by a lateral distance D2, and the lateral distance D2 may range from about 30 micrometers to about 1000 micrometers. In some embodiments, a portion of the rear surface of the semiconductor die 100 is covered by the insulating encapsulation 182, and the insulating encapsulation 182 is in contact with a sidewall of the warpage control pattern 150. The insulating encapsulation 182 may include first overhang portions 182a extending over the portions of the rear surface of the semiconductor die 100, and the first overhang portions 182a are in contact with the sidewall of the warpage control pattern 150. Furthermore, the thickness of the first overhang portions 182a may be substantially equal to the thickness of the warpage control pattern 150. In some alternative embodiments, the thickness of the first overhang portions 182a is slightly higher or lower than to the thickness of the warpage control pattern 150 due to grinding selectivity of the grinding process of the insulating encapsulation 182.

Figure 12:
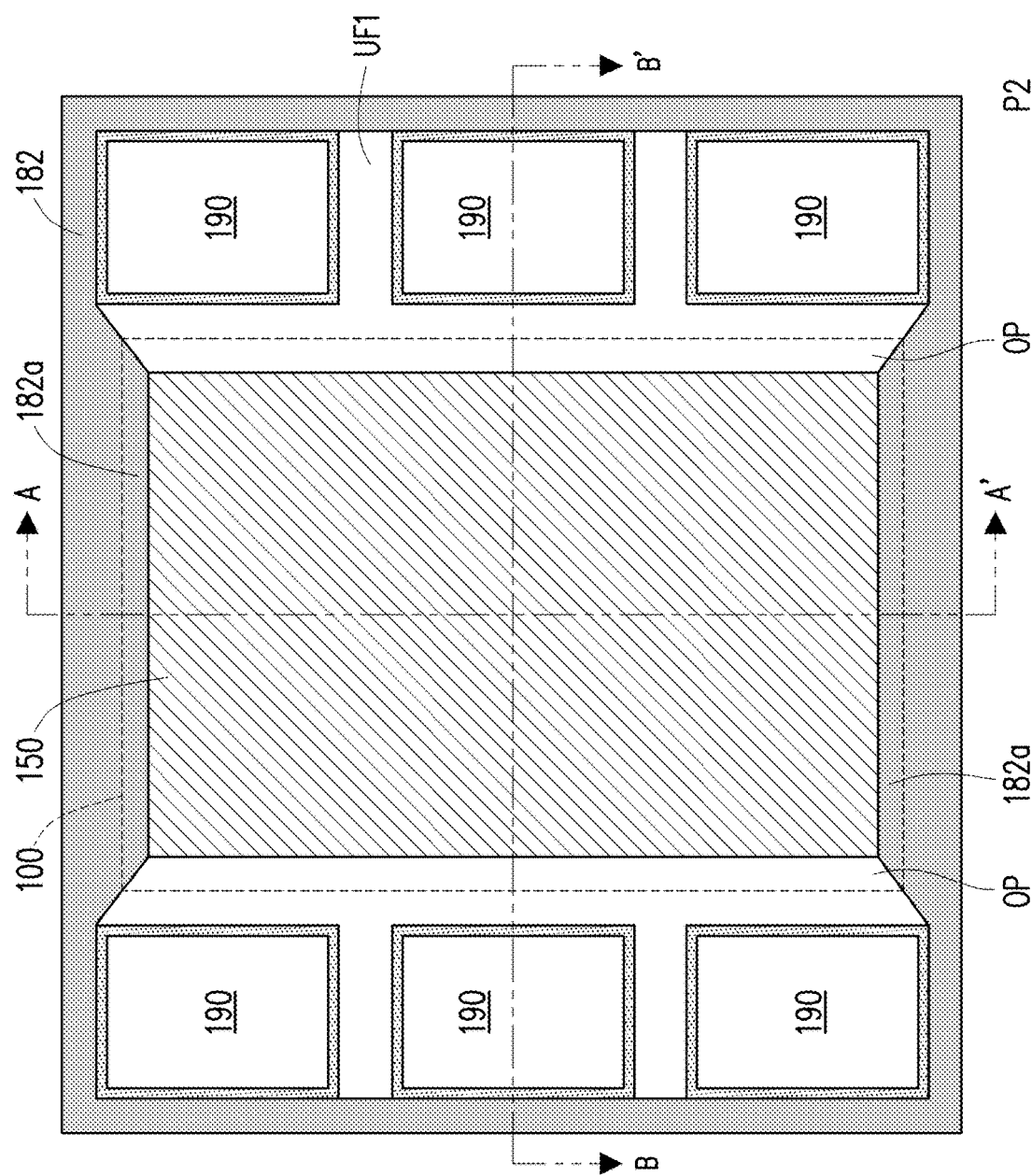
FIG. 12 is a top view schematically illustrating a package structure in accordance with some other embodiments of the present disclosure.
Figure 13:
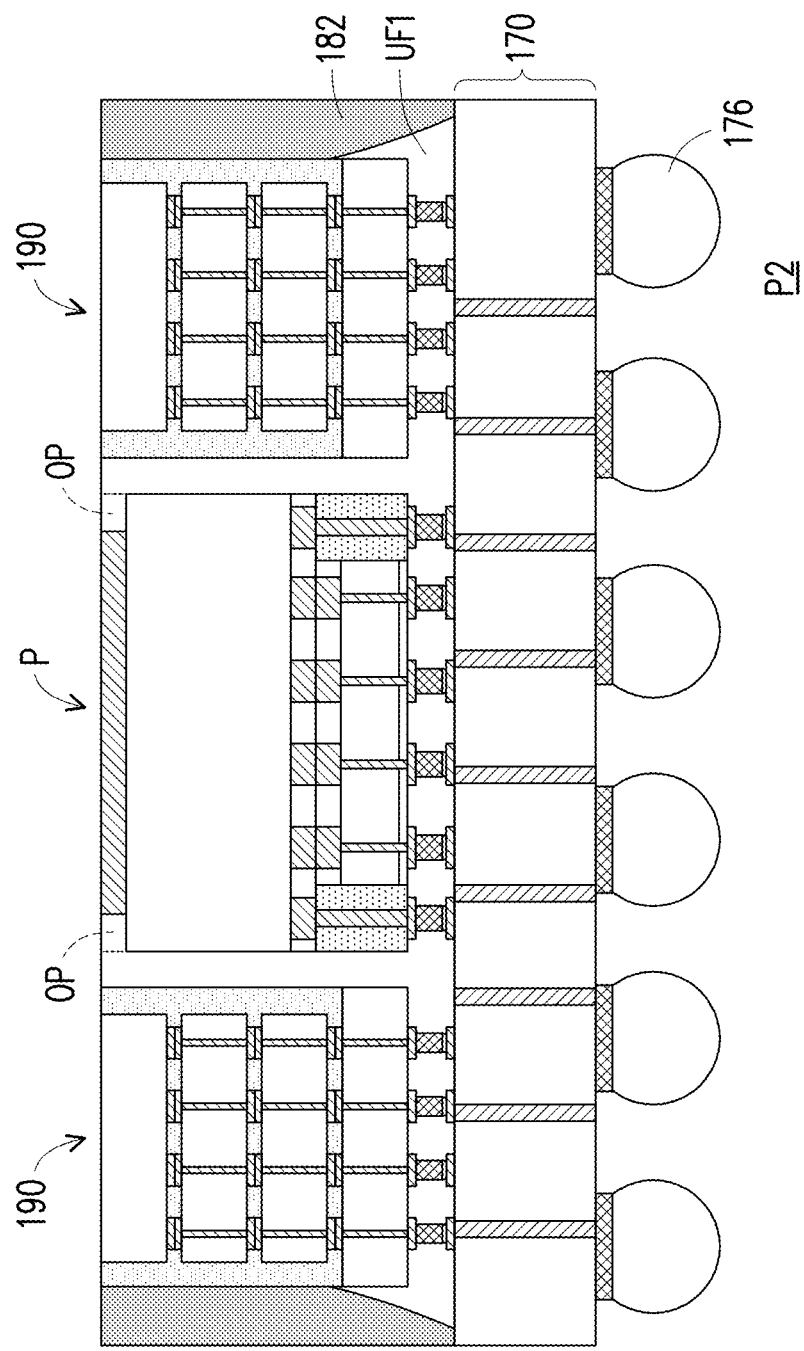
FIG. 13 is a cross-sectional view schematically illustrating a package structure cut along a cross-sectional line A-A' shown in FIG. 12 in accordance with some alternative embodiments of the present disclosure.
Figure 14:
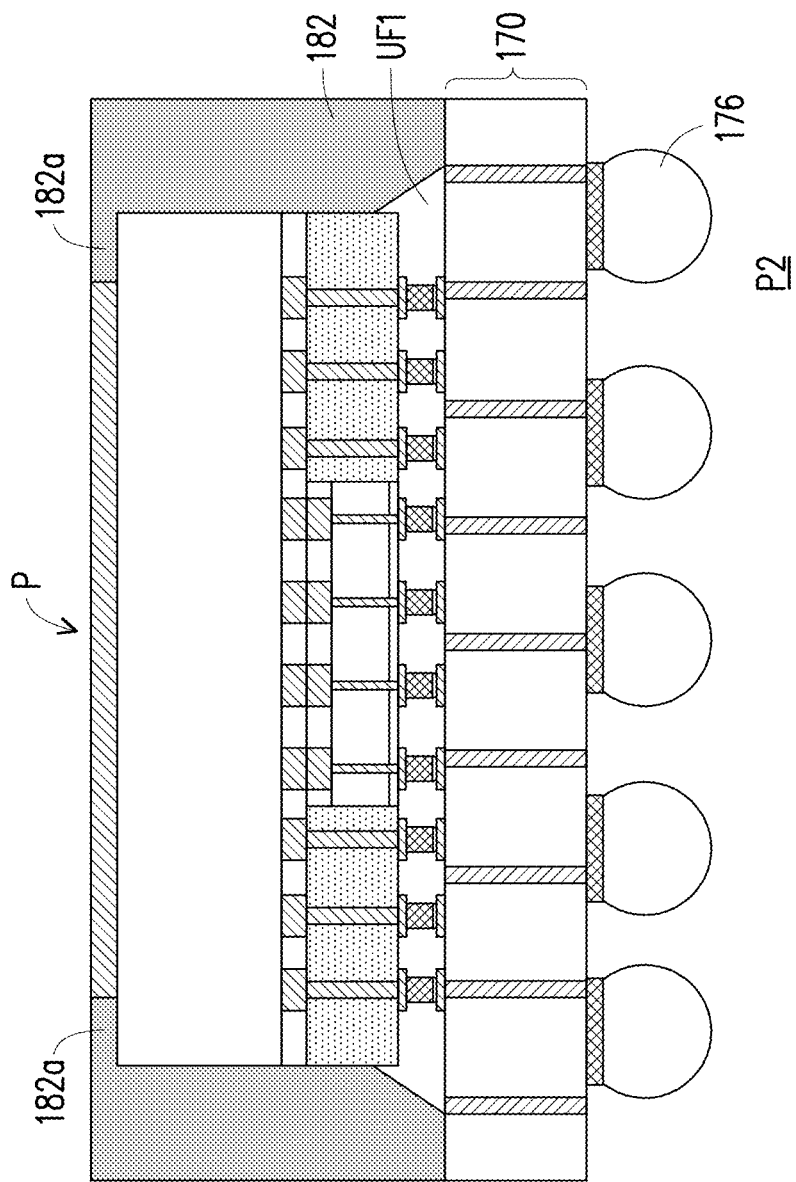
FIG. 14 is a cross-sectional view schematically illustrating a package structure cut along a cross-sectional line B-B' shown in FIG. 12 in accordance with some alternative embodiments of the present disclosure.

FIG. 12 is a top view schematically illustrating a package structure in accordance with some other embodiments of the present disclosure. FIG. 13 is a cross-sectional view schematically illustrating a package structure cut along a cross-sectional line A-A' shown in FIG. 12 in accordance with some alternative embodiments of the present disclosure. FIG. 14 is a cross-sectional view schematically illustrating a package structure cut along a cross-sectional line B-B' shown in FIG. 12 in accordance with some alternative embodiments of the present disclosure.

Referring to FIG. 11 through FIG. 14, a singulated package structure P2 is similar to the singulated package structure P1 except that the singulated package structure P2 further includes memory cubes 190 disposed on and electrically connected to the interposer 170, wherein the underfill UF1 fills a spacing between the interposer 170 and the semiconductor component P and gaps between the semiconductor component P and the memory cubes 190. In some embodiments, as illustrated in FIG. 12, the underfill UF1 includes second overhang portions OP over a portion of the rear surface of the semiconductor die 150, and the second overhang portions OP is in contact with the warpage control pattern 150. Furthermore, the thickness of the first overhang portion 182a and the second overhang portions OP may be substantially equal to the thickness of the warpage control pattern 150. In some alternative embodiments, the thickness of the first overhang portion 182a and the second overhang portions OP is slightly higher or lower than to the thickness of the warpage control pattern 150 due to grinding selectivity of the grinding process.

The first overhang portions 182a of the insulating encapsulation 182 are in contact with the second overhang portions OP of the underfill UF1, and interfaces are formed between the first overhang portions 182a and the second overhang portions OP. In some embodiments, the width of the first overhang portions 182a may be greater than the width of the second overhang portions OP. In some alternative embodiments, the width of the first overhang portions 182a may be substantially equal to or less than the width of the second overhang portions OP.

Figure 15:
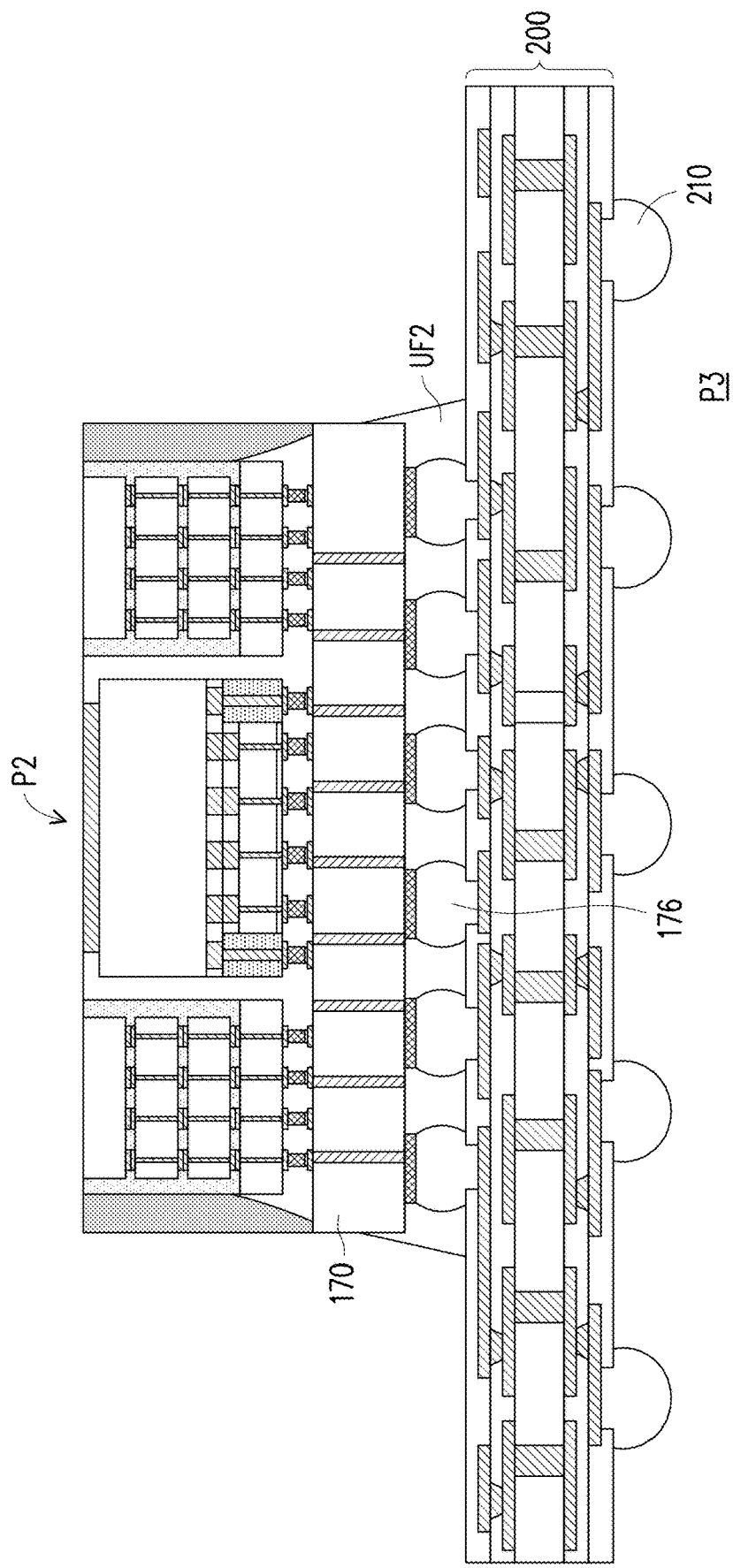
FIG. 15 is a cross-sectional view schematically illustrating a Chip-on-Wafer-on-Substrate (CoWoS) structure in accordance with some other embodiments of the present disclosure.

FIG. 15 is a cross-sectional view schematically illustrating a Chip-on-Wafer-on-Substrate (CoWoS) structure in accordance with some other embodiments of the present disclosure.

Referring to FIG. 15, a CoWoS structure P3 including a singulated package structure P2, a substrate 200 and an underfill UF2 is provided. The interposer 170 of the singulated package structure P2 is disposed on the substrate 200, the interposer 170 is electrically connected to the substrate 200 through the conductive terminals 176. Furthermore, the CoWoS structure P3 may include conductive terminals 210. In some embodiments, the conductive terminals 210 includes solder balls formed through a ball mount process followed by a reflow process. Since the warpage of the singulated package structure P2 can be well controlled, the reliability of the CoWoS structure P3 may be ensured.

In accordance with some embodiments of the disclosure, a structure including a first semiconductor die, a second semiconductor die, an insulating encapsulation and a warpage control pattern is provided. The first semiconductor die includes an active surface and a rear surface opposite to the active surface. The second semiconductor die is disposed on the active surface of the first semiconductor die. The insulating encapsulation is disposed on the active surface of the first semiconductor die and laterally encapsulates the second semiconductor die. The warpage control pattern is disposed on and partially covers the rear surface of the first semiconductor die. In some embodiments, the structure further includes a redistribution circuit structure disposed on the second semiconductor die and the insulating encapsulation, wherein the redistribution circuit structure is electrically connected to the first semiconductor die and the second semiconductor die. In some embodiments, the structure further includes conductive terminals disposed on and electrically connected to the redistribution circuit structure. In some embodiments, the structure further includes through semiconductor vias penetrating through the second semiconductor die, wherein the through semiconductor vias are electrically connected to the redistribution circuit structure. In some embodiments, the structure further includes through insulator vias penetrating through the insulating encapsulation, wherein the through insulator vias are electrically connected to the first semiconductor die and the redistribution circuit structure. In some embodiments, the distance ranges from about 30 micrometers to about 1000 micrometers, and a thickness of the warpage control pattern ranges from about 5 micrometers to about 15 micrometers.

In accordance with some other embodiments of the disclosure, a structure including an interposer, a semiconductor device, a second insulating encapsulation and an underfill is provided. The semiconductor device is disposed on and electrically connected to the interposer. The semiconductor device includes a first semiconductor die, a second semiconductor die, a first insulating encapsulation and a warpage control pattern. The first semiconductor die includes an active surface and a rear surface opposite to the active surface. The second semiconductor die is bonded with the active surface of the first semiconductor die. The first insulating encapsulation is disposed on the active surface of the first semiconductor die and laterally encapsulates the second semiconductor die, wherein sidewalls of the first insulating encapsulation is substantially aligned with sidewalls of the first semiconductor die. The warpage control pattern is disposed on and partially covers the rear surface of the first semiconductor die. The second insulating encapsulation is disposed on the interposer and laterally encapsulating the semiconductor device. The underfill is disposed between the semiconductor device and the interposer. In some embodiments, the semiconductor device further includes a redistribution circuit structure disposed on the second semiconductor die and the first insulating encapsulation, wherein the redistribution circuit structure is electrically connected to the first semiconductor die and the second semiconductor die. In some embodiments, the semiconductor device further includes conductive terminals disposed on and electrically connected to the redistribution circuit structure. In some embodiments, a sidewall of the warpage control pattern is separated from a sidewall of the first semiconductor die by a distance, and the distance ranges from about 30 micrometers to about 1000 micrometers. In some embodiments, a portion of the rear surface of the first semiconductor die is covered by the second insulating encapsulation, and the second insulating encapsulation is in contact with a sidewall of the warpage control pattern. In some embodiments, the second insulating encapsulation includes a first overhang portion extending over the portion of the rear surface of the first semiconductor die, and the first overhang portion is in contact with the sidewall of the warpage control pattern. In some embodiments, the structure further includes memory cubes disposed on and electrically connected to the interposer, wherein the underfill fills a spacing between the interposer and the semiconductor device and gaps between the semiconductor device and the memory cubes. In some embodiments, the underfill includes a second overhang portion over a portion of the rear surface of the first semiconductor die, and the second overhang portion is in contact with the warpage control pattern. In some embodiments, the structure further includes a substrate, wherein the interposer is electrically connected to the substrate and disposed between the substrate and the semiconductor device.

In accordance with some other embodiments of the disclosure, a method is provided. A semiconductor wafer including first semiconductor dies is provided. Second semiconductor dies are disposed on the semiconductor wafer such that the second semiconductor dies are electrically connected to the first semiconductor dies of the semiconductor wafer. The second semiconductor dies are laterally encapsulated by a first insulating encapsulation formed on the semiconductor wafer. Warpage control patterns are formed on a rear surface of the semiconductor wafer. The semiconductor wafer is singulated to form semiconductor devices each including at least one first semiconductor die among the first semiconductor dies, at least one second semiconductor die among the second semiconductor dies, and at least one warpage control pattern among the warpage control patterns. In some embodiments, the semiconductor wafer is singulated through a blade to form the semiconductor devices, and the warpage control patterns are not in contact by the blade when singulating the semiconductor wafer. In some embodiments, the method further includes mounting the semiconductor devices over an interposer wafer; and laterally encapsulating the semiconductor device with a second insulating encapsulation, wherein the second insulating encapsulation includes first overhang portions each extending over a portion of the rear surface of the first semiconductor die, and the first overhang portions are in contact with sidewalls of the warpage control patterns. In some embodiments, the method further includes forming underfills between the semiconductor devices and the interposer wafer before laterally encapsulating the semiconductor device with the second insulating encapsulation. In some embodiments, formation of the second insulating encapsulation includes forming an insulating material over the interposer wafer to cover the semiconductor devices; and partially removing the insulating material to form the second insulating encapsulation and reveal the warpage control patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a die stacking comprising a first semiconductor die, a second semiconductor die stacked over the first semiconductor die, and an insulating encapsulation laterally encapsulating the second semiconductor die, wherein a first lateral dimension of the first semiconductor die is greater than a second lateral dimension of the second semiconductor die; and
   a warpage control pattern disposed on the first semiconductor die, wherein the warpage control pattern and the second semiconductor die are disposed at opposite sides of the first semiconductor die, and the warpage control pattern is electrically floating.

2. The semiconductor device as claimed in claim 1 further comprising:
   a redistribution circuit structure disposed on the second semiconductor die and the insulating encapsulation, wherein the redistribution circuit structure is electrically connected to the first semiconductor die and the second semiconductor die.

3. The semiconductor device as claimed in claim 2 further comprising:
   conductive terminals disposed on and electrically connected to the redistribution circuit structure.

4. The semiconductor device as claimed in claim 2 further comprising:
   through semiconductor vias penetrating through the second semiconductor die, wherein the through semiconductor vias are electrically connected to the redistribution circuit structure.

5. The semiconductor device as claimed in claim 2 further comprising:
   through insulator vias penetrating through the insulating encapsulation, wherein the through insulator vias are electrically connected to the first semiconductor die and the redistribution circuit structure.

6. The semiconductor device as claimed in claim 1, wherein the warpage control pattern comprises rectangular patterns spaced apart from one another.

7. A structure, comprising:
   an interposer;
   a semiconductor device disposed on and electrically connected to the interposer, the semiconductor device comprising:
      a first semiconductor die;
      an encapsulated structure comprising a second semiconductor die stacked over the first semiconductor die and a first insulating encapsulation laterally encapsulating the second semiconductor die, wherein a first lateral dimension of the first semiconductor die is substantially equal to a second lateral dimension of the encapsulated structure;
      a warpage control pattern disposed on the first semiconductor die; and
   a second insulating encapsulation disposed on the interposer and laterally encapsulating the first semiconductor die, the encapsulated structure and the warpage control pattern.

8. The structure as claimed in claim 7, wherein the semiconductor device further comprises:
   a redistribution circuit structure disposed on the encapsulated structure, wherein the redistribution circuit structure is electrically connected to the first semiconductor die and the second semiconductor die.

9. The structure as claimed in claim 8, wherein the semiconductor device further comprises:
conductive terminals disposed on and electrically connected to the redistribution circuit structure.

10. The structure as claimed in claim 7, wherein a third lateral dimension of the warpage control pattern is smaller than the first lateral dimension of the first semiconductor die.

11. The structure as claimed in claim 7, wherein the warpage control pattern is disposed on a surface of the first semiconductor die, the second insulating encapsulation covers a portion of the surface of the first semiconductor die, and a top surface of the warpage control pattern substantially levels with the a top surface of the second insulating encapsulation.

12. The structure as claimed in claim 11, wherein the second insulating encapsulation includes first overhang portions extending over the portions of the surface of the first semiconductor die, and the first overhang portions are in contact with the warpage control pattern.

13. The structure as claimed in claim 12 further comprising:
an underfill disposed between the semiconductor device and the interposer, the underfill comprising second overhang portions in contact with the warpage control pattern; and
memory cubes disposed on and electrically connected to the interposer, wherein the underfill fills a spacing between the interposer and the semiconductor device and gaps between the semiconductor device and the memory cubes.

14. The structure as claimed in claim 13, wherein the second overhang portions of the underfill cover portions of the surface of the first semiconductor die.

15. The structure as claimed in claim 7 further comprising:
a substrate, wherein the interposer is electrically connected to the substrate and disposed between the substrate and the semiconductor device.

16. A method, comprising:
providing a semiconductor wafer comprising first semiconductor dies;
disposing second semiconductor dies on the semiconductor wafer;
laterally encapsulating the second semiconductor dies with a first insulating encapsulation formed on the semiconductor wafer such that a die stacking comprising the first semiconductor die, the second semiconductor die stacked over the first semiconductor die, and the insulating encapsulation laterally encapsulating the second semiconductor die is formed, wherein a first lateral dimension of the first semiconductor die is greater than a second lateral dimension of the second semiconductor die;
forming warpage control patterns on the first semiconductor dies of the semiconductor wafer, the warpage control patterns and the second semiconductor dies being located at opposite sides of the first semiconductor dies of the semiconductor wafer, and the warpage control pattern being electrically floating; and
performing a singulation process to cut the first insulating encapsulation and the semiconductor wafer to form semiconductor devices.

17. The method as claimed in claim 16, wherein the semiconductor wafer is singulated through a blade to form the semiconductor devices during the singulation process, and the warpage control patterns are not in contact by the blade during the singulation process.

18. The method as claimed in claim 16 further comprising:
mounting the semiconductor devices over an interposer wafer; and
laterally encapsulating the semiconductor device with a second insulating encapsulation, wherein the second insulating encapsulation includes first overhang portions in contact with the warpage control patterns.

19. The method as claimed in claim 18 further comprising:
forming underfills between the semiconductor devices and the interposer wafer before laterally encapsulating the semiconductor device with the second insulating encapsulation.

20. The method as claimed in claim 18, wherein laterally encapsulating the semiconductor device with the second insulating encapsulation comprises:
forming an insulating material over the interposer wafer to cover the semiconductor devices; and
partially removing the insulating material to form the second insulating encapsulation and reveal the warpage control patterns.

* * * * *